(12) United States Patent
Nakagawa et al.

(10) Patent No.: US 10,942,406 B2
(45) Date of Patent: Mar. 9, 2021

(54) THIN FILM TRANSISTOR SUBSTRATE AND DISPLAY PANEL

(71) Applicant: Panasonic Liquid Crystal Display Co., Ltd., Himeji (JP)

(72) Inventors: Teruhisa Nakagawa, Hyogo (JP); Tetsuya Kawamura, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 0 days.

(21) Appl. No.: 16/674,287

(22) Filed: Nov. 5, 2019

(65) Prior Publication Data

US 2020/0150504 A1 May 14, 2020

(30) Foreign Application Priority Data

Nov. 13, 2018 (JP) .............................. JP2018-212852

(51) Int. Cl.
| | |
|---|---|
| *G02F 1/1362* | (2006.01) |
| *H01L 27/12* | (2006.01) |
| *G02F 1/1343* | (2006.01) |
| *G02F 1/1339* | (2006.01) |
| *G02F 1/1368* | (2006.01) |
| *G02F 1/1345* | (2006.01) |
| *G02F 1/1335* | (2006.01) |

(Continued)

(52) U.S. Cl.
CPC ...... *G02F 1/136286* (2013.01); *G02F 1/1368* (2013.01); *G02F 1/13394* (2013.01); *G02F 1/13439* (2013.01); *G02F 1/13452* (2013.01); *H01L 27/124* (2013.01); *G02F 1/133512* (2013.01); *G02F 1/133514* (2013.01); *G02F 1/133784* (2013.01); *G02F 2001/136295* (2013.01); *G02F 2201/40* (2013.01); *H01L 27/1225* (2013.01); *H01L 27/1259* (2013.01); *H01L 29/7869* (2013.01)

(58) Field of Classification Search
None
See application file for complete search history.

(56) References Cited

U.S. PATENT DOCUMENTS

| | | | |
|---|---|---|---|
| 9,293,102 B1 * | 3/2016 | Chiu | .................. G02F 1/1368 |
| 10,564,502 B1 * | 2/2020 | Nakagawa | ............ G02F 1/1368 |

(Continued)

FOREIGN PATENT DOCUMENTS

| | | |
|---|---|---|
| JP | 2008-501138 | 1/2008 |
| WO | 2005/116744 | 12/2005 |

*Primary Examiner* — Ryan Crockett
(74) *Attorney, Agent, or Firm* — Hamre, Schumann, Mueller & Larson, P.C.

(57) ABSTRACT

A thin film transistor substrate including a pixel region constructed with pixels, includes: gate signal lines provided in the pixel region and extending in a first direction; gate lead-out lines provided in the pixel region and extending in a second direction; a thin film transistor and a pixel electrode provided in each of the pixels; a common electrode provided across the pixels; and a common line electrically connected to the common electrode. The gate signal lines and the gate lead-out lines are connected to each other through a first contact hole at at least one of a plurality of intersections of the gate signal lines and the gate lead-out lines, and the common line covers the first contact hole in planar view of the thin film transistor substrate.

12 Claims, 7 Drawing Sheets

(51) Int. Cl.
*H01L 29/786* (2006.01)
*G02F 1/1337* (2006.01)

(56) References Cited

U.S. PATENT DOCUMENTS

| | | | | |
|---|---|---|---|---|
| 2004/0263751 | A1* | 12/2004 | Kim | G02F 1/134363 349/141 |
| 2008/0018583 | A1* | 1/2008 | Knapp | G02F 1/134309 345/99 |
| 2013/0265513 | A1* | 10/2013 | Ogasawara | G02F 1/136286 349/33 |
| 2019/0129538 | A1* | 5/2019 | Yoshida | G06F 3/044 |

* cited by examiner

THIN FILM TRANSISTOR SUBSTRATE AND DISPLAY PANEL

CROSS-REFERENCE TO RELATED APPLICATION

This application claims priority from Japanese application JP 2018-212852, filed on Nov. 13, 2018. This Japanese application is incorporated herein by reference.

BACKGROUND

The present disclosure relates to a thin film transistor substrate and a display panel including the thin film transistor substrate.

A display panel such as a liquid crystal display panel and an organic electro luminescence (EL) display panel includes a thin film transistor substrate in which a thin film transistor (TFT) is provided (hereinafter, referred to as a "TFT substrate").

In particular, a display panel of an active matrix driving system includes an active matrix substrate in which the TFT is provided in each pixel of a pixel region is provided as the TFT substrate. For example, the liquid crystal display panel of the active matrix driving system includes the TFT substrate in which the TFT is provided as a switching element in each pixel, a counter substrate opposed to the TFT substrate, and a liquid crystal layer disposed between the TFT substrate and the counter substrate.

In the pixel region of the TFT substrate, a plurality of wiring lines such as gate signal lines and source signal lines are formed in addition to the TFT. A gate driver integrated circuit (IC) that supplies a gate signal to the gate signal lines and a source driver IC that supplies a video signal to the source signal lines are mounted on the TFT substrate.

Examples of a method for mounting the gate driver IC and the source driver IC include a COF (Chip On Film) system in which a tape carrier package (TCP) in which the gate driver IC and the source driver IC are mounted on a flexible wiring substrate is connected to a frame region of the TFT substrate and a chip on glass (COG) system in which the gate driver IC and the source driver IC are directly mounted on the TFT substrate. For this reason, terminal electrodes are formed in the frame region of the TFT substrate in order to mount the gate driver IC and the source driver IC.

Generally, the gate driver IC and the source driver IC are mounted in the frame region of two adjacent sides of a rectangular display panel. However, in recent years, a technique of mounting the gate driver IC and the source driver IC on the same side of the frame region has been proposed for the purpose of narrowing the frame of the display panel (for example, Japanese Translation of PCT Publication No. 2008-501138).

SUMMARY

When the gate driver IC and the source driver IC are mounted on the same side of the frame region, for example, it is conceivable that the gate driver IC and the source driver IC are mounted only on one side of two sides (specifically, long sides) opposed to each other in a column direction.

In this case, in order to electrically connect the gate driver IC and the gate signal lines (horizontal gate lines) extending in a row direction, a plurality of gate lead-out lines (longitudinal gate lines) extending in the column direction are separately formed in the pixel region, and the plurality of gate lead-out lines and the plurality of gate signal lines orthogonal to each other are connected to each other through contact holes. Consequently, even if the gate driver IC and the source driver IC are mounted on the same side, the gate driver IC and the gate signal lines can be electrically connected to each other through the gate lead-out lines.

The present disclosure provides a TFT substrate and a display panel capable of improving connecting properties between the plurality of gate signal lines and the plurality of gate lead-out lines.

For example, the present disclosure may improve an appearance inspection of the TFT substrate.

A thin film transistor substrate according to the present disclosure includes a pixel region constructed with a plurality of pixels. The thin film transistor substrate includes: a plurality of gate signal lines provided in the pixel region and extending in a first direction; a plurality of gate lead-out lines provided in the pixel region and extending in a second direction different from the first direction; a thin film transistor and a pixel electrode provided in each of the plurality of pixels; a common electrode provided across the plurality of pixels; and a common line electrically connected to the common electrode. The plurality of gate signal lines and the plurality of gate lead-out lines are connected to each other through a first contact hole at at least one of a plurality of intersections of the plurality of gate signal lines and the plurality of gate lead-out lines, and the common line covers the first contact hole in planar view of the thin film transistor substrate.

A display panel according to the present disclosure includes: the thin film transistor substrate disclosed above; and a counter substrate opposed to the thin film transistor substrate.

DETAILED DESCRIPTION

The following describes an exemplary embodiment of the present disclosure. The embodiment described below is merely one specific example of the present disclosure. The numerical values, shapes, materials, elements, and arrangement and connection of the elements, etc. indicated in the following embodiment are given merely by way of illustration and are not intended to limit the present disclosure. Therefore, among elements in the following embodiment, those not recited in any one of the independent claims defining the broadest inventive concept of the present disclosure are described as optional elements.

Note that the figures are schematic illustrations and are not necessarily precise depictions. Accordingly, the figures are not necessarily to scale. Moreover, in the figures, elements that are essentially the same share like reference signs. Accordingly, duplicate description is omitted or simplified.

Exemplary Embodiment

Figure 1:
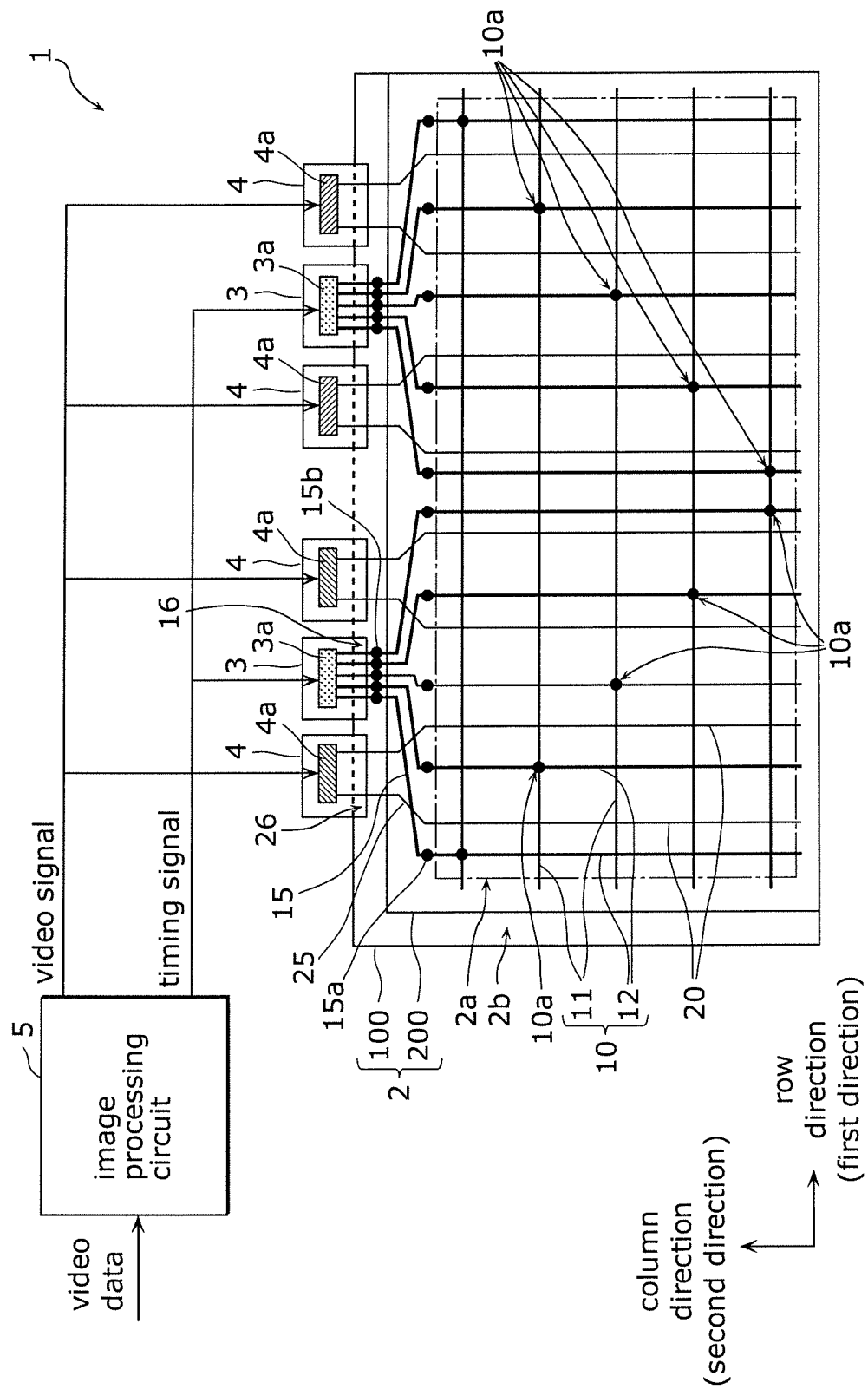
FIG. 1 is a schematic view illustrating a display device according to an exemplary embodiment.

Image display device 1 according to an exemplary embodiment will be described below with reference to FIG. 1. FIG. 1 is a view illustrating a schematic configuration of image display device 1 of the exemplary embodiment.

Image display device 1 displays an image (video) in a pixel region constructed with a plurality of pixels. The image displayed on image display device 1 may be either a still image or a moving image.

As illustrated in FIG. 1, image display device 1 includes display panel 2, gate COF 3, source COF 4, and image processing circuit 5. In the exemplary embodiment, because image display device 1 is a liquid crystal display device, display panel 2 is a liquid crystal display panel. Although not illustrated, image display device 1 includes a backlight disposed on a back surface side of display panel 2.

Display panel 2 is a liquid crystal display panel that displays a color image, and includes a liquid crystal cell in which a liquid crystal layer is provided between a pair of substrates and a pair of polarizing plates sandwiching the liquid crystal cell.

One of the pair of substrates sandwiching the liquid crystal layer is TFT substrate 100 (first substrate) on which the TFT, the wiring lines, and the like are formed, and the other of the pair of substrates is CF substrate 200 (second substrate) on which R (red), G (green), and B (blue) color filters (CF) are formed.

In the exemplary embodiment, because display panel 2 is an active matrix driving type display panel, TFT substrate 100 is an active matrix substrate (TFT array substrate) in which a plurality of TFTs are provided into a matrix form or the like. For example, a liquid crystal driving system of display panel 2 is a lateral electric field system such as an in-plane switching (IPS) system or a fringe field switching (FFS) system. Alternatively, the liquid crystal driving system may be a vertical alignment (VA) system or a twisted nematic (TN) system.

As illustrated in FIG. 1, display panel 2 includes pixel region 2a constructed with a plurality of pixels and frame region 2b surrounding pixel region 2a. That is, TFT substrate 100 and CF substrate 200 include pixel region 2a and frame region 2b. Pixel region 2a is an image display region (effective region) in which an image is displayed. For example, pixel region 2a is constructed with a plurality of pixels arranged into a matrix form. Frame region 2b is a peripheral region of display panel 2, and is located outside pixel region 2a. In the exemplary embodiment, display panel 2 has a rectangular shape in planar view. Thus, pixel region 2a has the rectangular shape, and frame region 2b has the rectangular shape.

TFT substrate 100 includes a plurality of gate signal lines (scanning signal lines) 11 extending in a first direction and a plurality of source signal lines (video signal lines) 20 extending in a second direction different from the first direction. In the exemplary embodiment, the plurality of gate signal lines 11 extend in a row direction. On the other hand, the plurality of source signal lines 20 extend in a column direction that is a direction orthogonal to the row direction of pixel region 2a.

TFT substrate 100 further includes a plurality of gate lead-out lines 12 extending in the second direction. Specifically, the plurality of gate lead-out lines 12 extend in the column direction. That is, the plurality of gate lead-out lines 12 are formed in parallel with the plurality of source signal lines 20, and are orthogonal to the plurality of gate signal lines 11. As described above, gate signal line 11 (first gate line) that is a horizontal gate line extending in the row direction and gate lead-out line 12 (second gate line) that is a vertical gate line extending in the column direction are provided as gate line 10 in display panel 2.

The plurality of gate signal lines 11, the plurality of gate lead-out lines 12, and the plurality of source signal lines 20 are provided in at least pixel region 2a. Specifically, the plurality of gate signal lines 11, the plurality of gate lead-out lines 12, and the plurality of source signal lines 20 are provided over whole pixel region 2a.

Because gate signal line 11 and source signal line 20 are orthogonal to each other, gate signal line 11 and source signal line 20 are formed in different metal layers (wiring layers). Similarly, because gate signal line 11 and gate lead-out line 12 are orthogonal to each other, gate signal line 11 and gate lead-out line 12 are formed in different metal layers. Source signal line 20 and gate lead-out line 12 extending in the column direction are disposed in the same layer (that is, formed in the same metal layer).

In the exemplary embodiment, a first metal layer in which gate signal line 11 is formed is located below a second metal layer in which source signal line 20 and gate lead-out line 12 are formed. Specifically, gate signal line 11 is covered with a gate insulator, and source signal line 20 and gate lead-out line 12 are disposed on the gate insulator. That is, the gate insulator is formed as an interlayer insulating film between the first metal layer in which gate signal line 11 is formed and the second metal layer in which source signal line 20 and gate lead-out line 12 are formed.

Each of the plurality of gate signal lines 11 is electrically connected to at least one gate lead-out lines 12. Specifically, the plurality of gate signal lines 11 and the plurality of gate lead-out lines 12 are connected to each other through first gate contact hole 10a (first contact hole) at least one point of a plurality of intersections of the plurality of gate signal lines 11 and the plurality of gate lead-out lines 12 in pixel region 2a.

In the exemplary embodiment, one gate signal line 11 extending in the row direction is connected to two gate lead-out lines 12 extending in the column direction. That is, one gate signal line 11 is connected to two gate lead-out lines 12 at two first gate contact holes 10a. A number of first gate contact holes 10a in one gate signal line 11 is not limited to two, and only needs to be at least one. The number of first gate contact holes 10a may be three or more, for example. That is, one gate signal line 11 only needs to be connected to at least one gate lead-out line 12.

Gate COF 3 is a TCP in which gate driver IC 3a is mounted on a flexible substrate such as a flexible flat cable (FFC) or a flexible printed cable (FPC), and gate COF 3 is mounted in frame region 2b of display panel 2 by the COF system.

Specifically, gate terminal portion 16 constructed with a plurality of gate terminal electrodes is provided on one side of frame region 2b of TFT substrate 100, and gate COF 3 is connected to gate terminal portion 16 by, for example, anisotropic conductive film (ACF) pressure bonding.

Gate driver IC 3a of gate COF 3 is electrically connected to gate signal line 11. In the exemplary embodiment, gate driver IC 3a is electrically connected to gate signal line 11 through gate lead-out line 12. Specifically, gate driver IC 3a is electrically connected to gate signal line 11 and gate lead-out line 12 by gate relay line 15 provided in frame region 2b of TFT substrate 100.

The plurality of gate relay lines 15 connect the plurality of gate lead-out lines 12 and the gate terminal electrodes of gate terminal portion 16. Gate relay line 15 is formed in a metal layer different from a metal layer of gate lead-out line 12, and connected to gate lead-out line 12 through contact hole 15a. Gate relay line 15 is connected to the gate terminal electrode of gate terminal portion 16 through contact hole 15b. In the exemplary embodiment, gate relay line 15 is formed in the same layer as that of source signal line 20. Thus, contact holes 15a and 15b are formed in the gate insulator between the first metal layer in which gate signal line 11 is formed and the second metal layer in which gate relay line 15 and source signal line 20 are formed.

Gate driver IC 3a supplies to gate signal line 11 voltage (gate-on voltage) turning on the TFT of the pixel in which the video signal is to be written according to a timing signal input from image processing circuit 5. The gate-on voltage serves as a gate signal.

Similarly to gate COF 3, source COF 4 is the TCP in which source driver IC 4a is mounted on the flexible substrate such as FFC or FPC, and source COF 4 is mounted in frame region 2b of TFT substrate 100 by the COF system.

Specifically, source terminal portion 26 constructed with a plurality of source terminal electrodes is provided in the same side as that of gate terminal portion 16 in frame region 2b of TFT substrate 100, and source COF 4 is connected to source terminal portion 26 by, for example, ACF pressure bonding.

As described above, because gate terminal portion 16 to which gate COF 3 is connected and source terminal portion 26 to which source COF 4 is connected are provided in the same side of frame region 2b, gate COF 3 and source COF 4 are mounted in the same side of frame region 2b. In the exemplary embodiment, all gate COFs 3 and all source COFs 4 are connected to only one side (specifically, a long side) of two sides opposed to each other in the column direction among four sides of frame region 2b.

Source driver IC 4a of source COF 4 is electrically connected to source signal line 20. Specifically, source driver IC 4a is electrically connected to source signal line 20 by gate relay line 25 provided in frame region 2b of display panel 2.

The plurality of gate relay lines 25 connect the plurality of source signal lines 20 and source terminal portion 26. Gate relay line 25 is formed in the same metal layer as that of source signal line 20, and formed in the layer different from that of gate relay line 15. Consequently, gate relay line 25 and gate relay line 15 can intersect with each other. Because gate relay line 25 and source signal line 20 are formed in the same metal layer, gate relay line 25 and source signal line 20 are continuously formed with no use of the contact hole.

Source driver IC 4a supplies to source signal line 20 the voltage corresponding to the video signal, which represents a gradation value of each pixel and is input from image processing circuit 5 to each TFT connected to selected gate signal line 11, according to gate signal line 11 selected by gate driver IC 3a. Consequently, the video signal is written in the pixel corresponding to selected gate signal line 11.

Image processing circuit 5 includes an arithmetic processing circuit such as a central processing unit (CPU) and a memory such as a read only memory (ROM) and a random access memory (RAM). Video data is input to image processing circuit 5. In image processing circuit 5, the CPU reads and executes a program stored in the memory, thereby performing various pieces of processing. Specifically, image processing circuit 5 performs various pieces of image signal processing such as color adjustment on the video data to generate the video signal indicating the gradation value of each pixel and the timing signal, and outputs the video signal to source driver IC 4a and outputs the timing signal to gate driver IC 3a.

In display panel 2 having the above configuration, when the gate-on voltage is supplied from gate driver IC 3a to gate signal line 11 through gate relay line 15, the TFT of the selected pixel is turned on, and the video signal is supplied from source signal line 20 connected to the TFT to the pixel electrode. An electric field is generated in the liquid crystal layer of display panel 2 due to a difference between the data voltage of the video signal supplied to the pixel electrode and the common voltage supplied to the common electrode serving as a pair of pixel electrodes. An alignment state of liquid crystal molecules of the liquid crystal layer in each pixel is changed by the electric field, and transmittance of light of the backlight passing through display panel 2 is controlled in each pixel. Consequently, a desired image is displayed in pixel region 2a of display panel 2.

Figure 2:
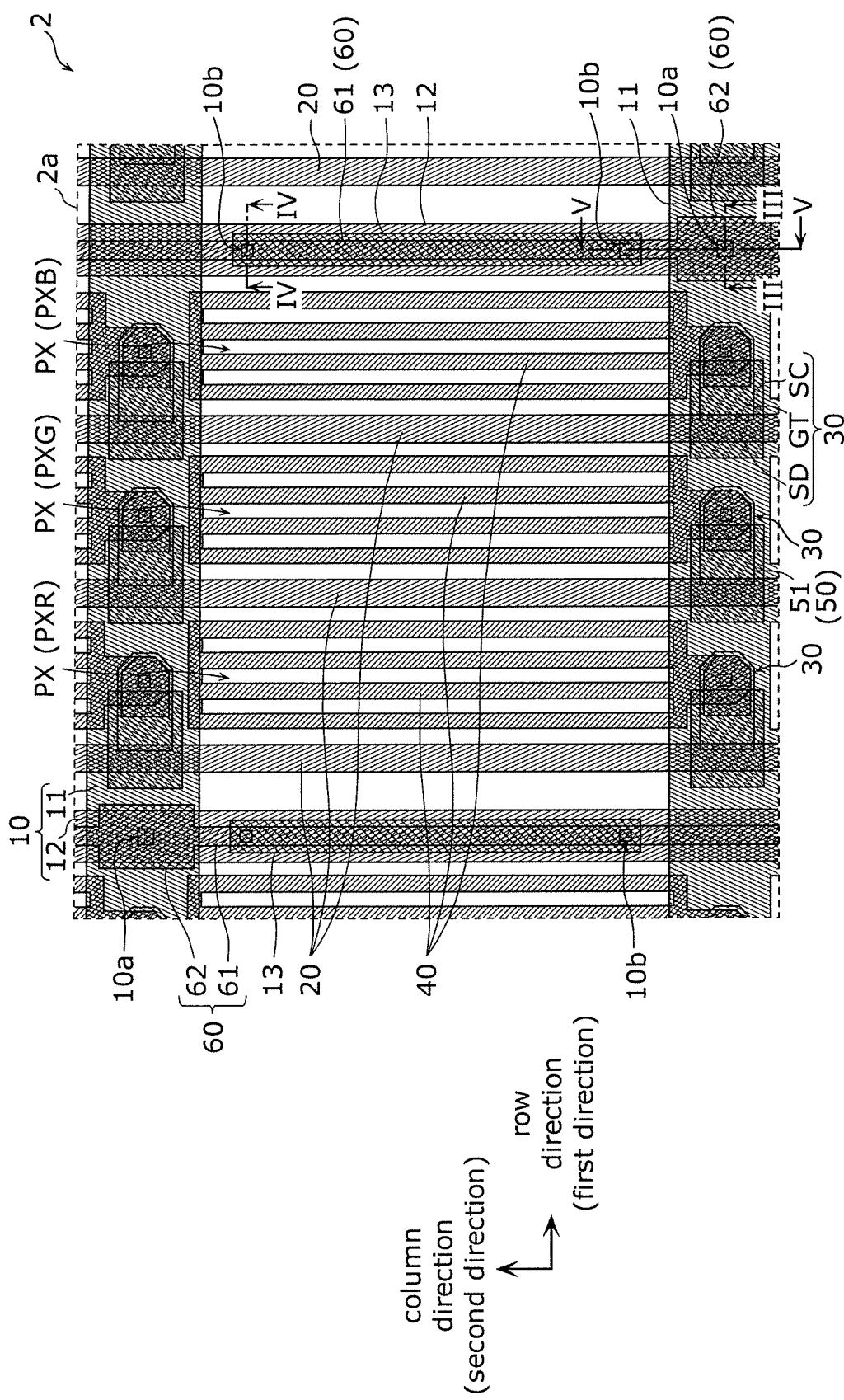
FIG. 2 is a plan view illustrating a configuration of a display panel of the exemplary embodiment.
Figure 3:
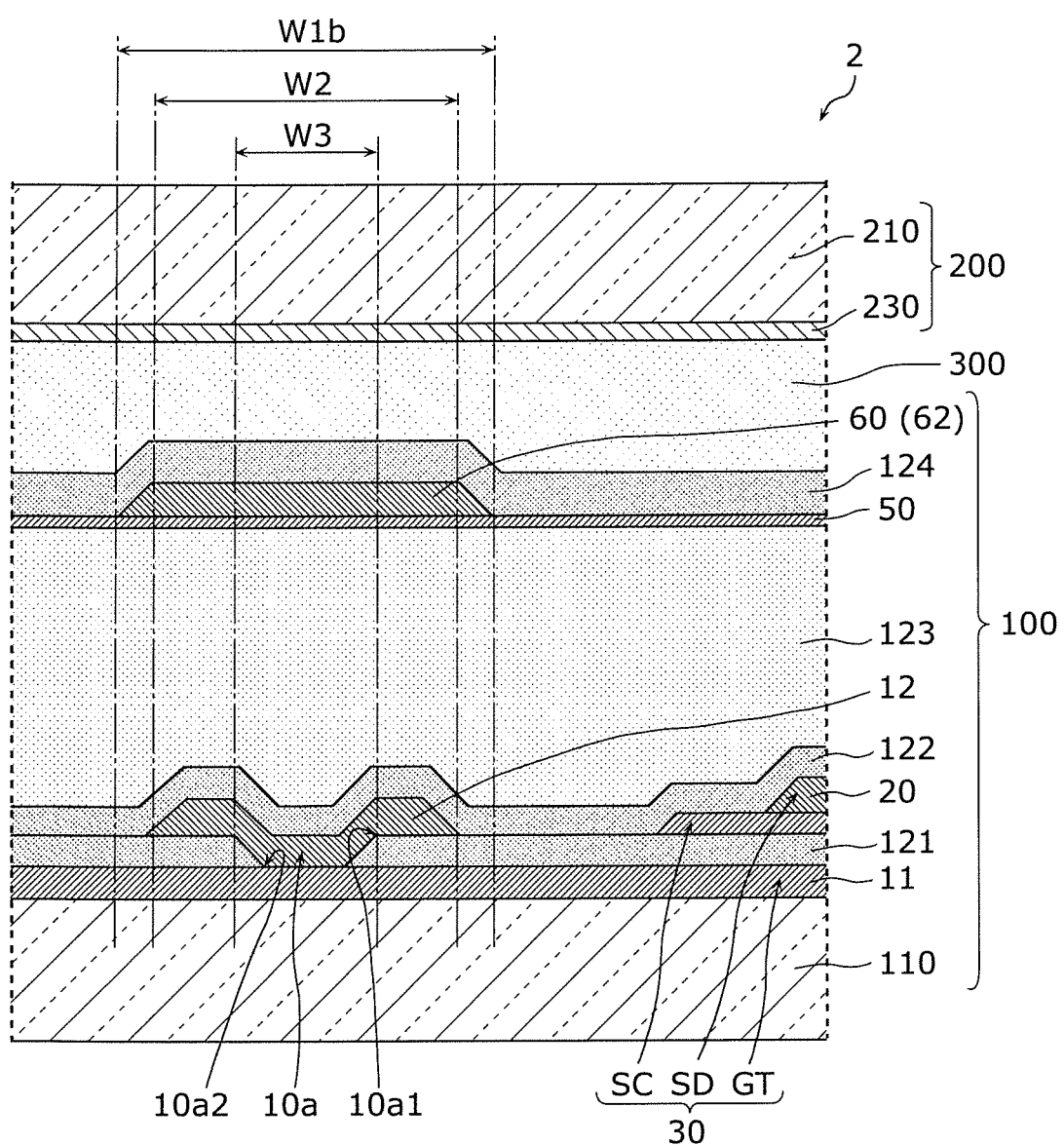
FIG. 3 is a partial sectional view of the display panel according to the exemplary embodiment, taken along line III-III in FIG. 2.
Figure 4:
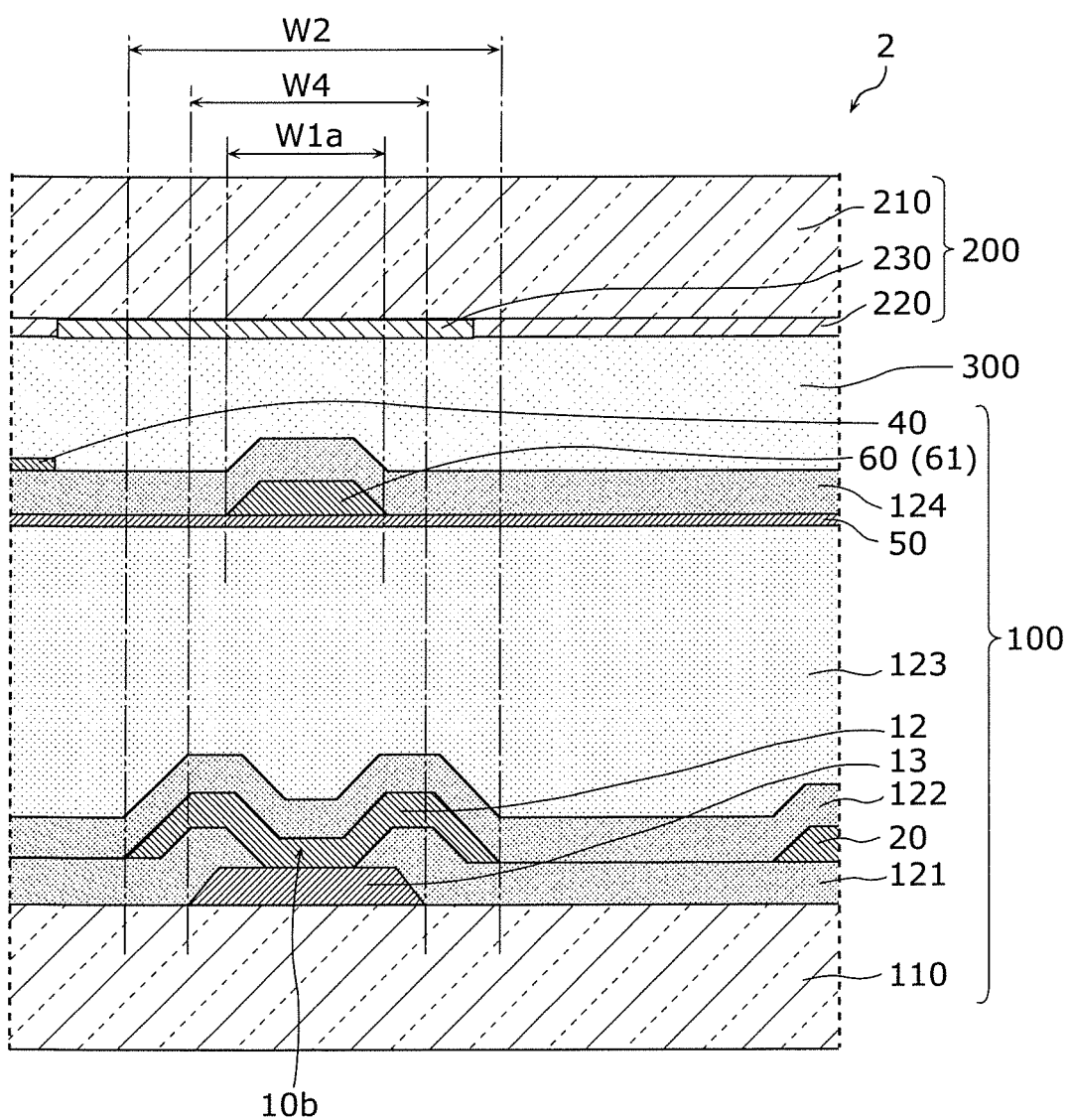
FIG. 4 is a partial sectional view of the display panel according to the exemplary embodiment, taken along line IV-IV in FIG. 2.
Figure 5:
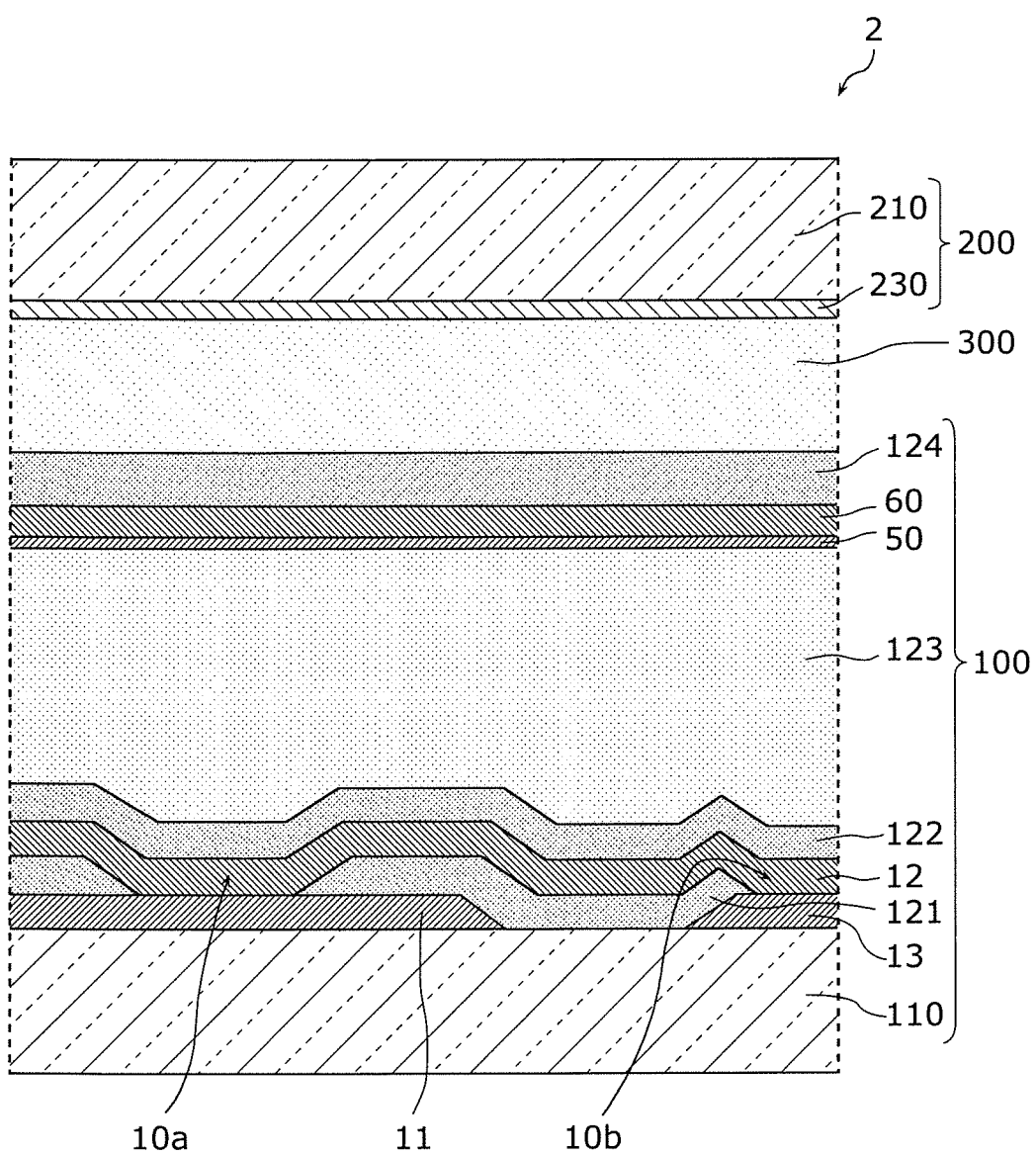
FIG. 5 is a partial sectional view of the display panel according to the exemplary embodiment, taken along line V-V in FIG. 2.

A specific structure of display panel 2 will be described below with reference to FIGS. 1 to 5. FIG. 2 is a plan view illustrating a configuration of the pixel in display panel 2 of the exemplary embodiment. FIG. 3 is a sectional view illustrating display panel 2 taken along a line III-III in FIG. 2, FIG. 4 is a sectional view illustrating display panel 2 taken along a line IV-IV in FIG. 2, and FIG. 5 is a sectional view illustrating display panel 2 taken along a line V-V in FIG. 2.

As illustrated in FIG. 2, TFT 30, pixel electrode 40, and common electrode 50 are provided in each of the plurality of pixels PX (subpixels). TFT 30 includes gate electrode GT and a pair of source-drain electrodes SD. One of the pair of source-drain electrodes SD is a source electrode, and the other is a drain electrode.

One TFT 30 and one pixel electrode 40 are provided in each pixel PX. Specifically, one TFT 30 and one pixel electrode 40 are provided in each of red pixel PXR, green pixel PXG, and blue pixel PXB. A plurality of TFTs 30 and a plurality of pixel electrodes 40 may be provided in each pixel PX.

Common electrode 50 is provided across the plurality of pixels PX. In the exemplary embodiment, common electrode 50 is provided across all pixels PX in pixel region 2a. That is, common electrode 50 is one planar electrode common to all pixels PX, and is formed over whole pixel region 2a.

As described above, the plurality of gate signal lines 11 extending in the row direction (first direction), and the plurality of source signal lines 20 and gate lead-out lines 12 extending in the column direction (second direction) orthogonal to the row direction are formed in display panel 2. Each pixel PX in pixel region 2a is a region surrounded by gate signal lines 11 extending in the row direction and source signal lines 20 extending in the column direction.

One gate signal line 11 is provided at each boundary between two pixels PX adjacent to each other in the column direction. Each gate signal line 11 is connected to respective TFTs 30 of the plurality of pixels PX arrayed in the row direction. Specifically, each gate signal line 11 is connected to gate electrodes GT of respective TFTs 30.

One source signal line 20 is provided at each boundary between two pixels PX adjacent to each other in the row direction. Each source signal line 20 is connected to the plurality of TFTs 30 of the plurality of respective pixels PX arrayed in the column direction. Specifically, each source signal line 20 is connected to one of the pair of source-drain electrodes SD of respective TFTs 30. In each pixel PX, the other of source-drain electrode SD of TFT 30 is connected to pixel electrode 40.

Gate lead-out line 12 is provided between two pixels PX adjacent to each other in the row direction. For example, as illustrated in FIG. 2, gate lead-out line 12 is provided in part in every three pixels PX adjacent to one another in the row direction. Specifically, one gate lead-out line 12 is provided in each unit of three subpixels with the three subpixels of red pixel PXR, green pixel PXG, and blue pixel PXB. Gate lead-out line 12 may be formed between any pixels in pixel region 2a according to the number of the plurality of gate signal lines 11 extending in the row direction.

A sectional structure of display panel 2 will mainly be described below. As illustrated in FIGS. 3 to 5, display panel 2 includes TFT substrate 100, CF substrate 200 opposed to TFT substrate 100, and liquid crystal layer 300 disposed between TFT substrate 100 and CF substrate 200. Although not illustrated, liquid crystal layer 300 is sealed between TFT substrate 100 and CF substrate 200 by a frame-shaped sealing member formed in frame region 2b.

TFT 30, various wiring lines such as gate signal line 11, gate lead-out line 12, gate auxiliary line 13, and source signal line 20, the interlayer insulating film formed between these wiring lines, pixel electrode 40, common electrode 50, and common line 60 are provided in TFT substrate 100. These members are formed on first transparent substrate 110. For example, first transparent substrate 110 is a transparent base material of a glass substrate or a transparent resin substrate.

TFT 30 formed on first transparent substrate 110 is constructed with gate electrode GT, a pair of source-drain electrodes SD, and semiconductor layer SC constituting a channel layer. In the exemplary embodiment, TFT 30 is a TFT having a bottom gate structure, and includes gate electrode GT formed on first transparent substrate 110, first insulating film 121 that is the gate insulator formed on gate electrode GT, and semiconductor layer SC formed above gate electrode GT with first insulating film 121 interposed therebetween. The pair of source-drain electrodes SD are formed on semiconductor layer SC.

For example, gate electrode GT may be made of a metal film having a two-layer structure of a molybdenum film and a copper film or a single-layer metal film of a copper film or the like. For example, first insulating film 121 may be made of an insulating film having a two-layer structure of a silicon oxide film and a silicon nitride film or a single-layer insulating film of a silicon oxide film or a silicon nitride film. For example, semiconductor layer SC may be made of a semiconductor film having a two-layer structure of an i-amorphous silicon film and an n-amorphous silicon film or a single-layer semiconductor film. For example, the pair of source-drain electrodes SD may be made of a metal film having a two-layer structure of a molybdenum film and a copper film or a single-layer metal film of a copper film or the like.

The materials for gate electrode GT, the pair of source-drain electrodes SD, semiconductor layer SC, and first insulating film (gate insulator) 121 are not limited to the above materials. For example, an In—Ga—Zn—O-based oxide semiconductor may be used as the material for semiconductor layer SC.

As illustrated in FIG. 3, gate signal line 11 is formed in the same layer as that of gate electrode GT. That is, gate signal line 11 and gate electrode GT are formed in the first metal layer, and formed by patterning the same metal film. In the exemplary embodiment, gate electrode GT is a part of gate signal line 11.

Source signal line 20 and gate lead-out line 12 are formed in the same layer as that of the pair of source-drain electrodes SD. That is, source signal line 20, gate lead-out line 12, and the pair of source-drain electrodes SD are formed in the second metal layer, and formed by patterning the same metal film. In the exemplary embodiment, one of the pair of source-drain electrodes SD connected to source signal line 20 is a part of source signal line 20.

The first metal layer in which gate signal line 11 and gate electrode GT are formed is located below the second metal layer. Thus, gate signal line 11 and gate electrode GT are formed in a metal layer different from that of source signal line 20, gate lead-out line 12, and the pair of source-drain electrodes SD.

As illustrated in FIGS. 2, 3, and 5, gate signal line 11 and gate lead-out line 12 formed in different metal layers are connected to each other through first gate contact hole 10a. First gate contact hole 10a is a contact portion between gate signal line 11 and gate lead-out line 12, and is made in first insulating film 121 between the first metal layer in which gate signal line 11 is formed and the second metal layer in which gate lead-out line 12 is formed as illustrated in FIGS. 3 and 5.

As illustrated in FIGS. 2, 3, and 5, first gate contact hole 10a includes upper opening 10a1 that is open on the second metal layer side (the side of gate lead-out line 12) on which gate lead-out line 12 is formed and lower opening 10a2 that is open on the first metal layer side (the side of gate signal line 11) on which gate signal line 11 is formed. That is, upper opening 10a1 of first gate contact hole 10a is formed on a top surface facing the second metal layer side of first insulating film 121, and lower opening 10a2 is formed on a lower surface facing the first metal layer side of first insulating film 121.

As illustrated in FIGS. 2 and 4, gate auxiliary line 13 is formed on TFT substrate 100 so as to overlap gate lead-out line 12. Specifically, as illustrated in FIG. 2, gate auxiliary line 13 is formed so as to extend in the column direction. That is, gate auxiliary line 13 is formed in parallel to source signal line 20 in planar view.

Gate auxiliary line 13 is formed in the same layer as that of gate signal line 11. That is, gate auxiliary line 13 and gate signal line 11 are formed in the same first metal layer, and formed by patterning the same metal film.

In the exemplary embodiment, gate auxiliary line 13 is formed into an island shape. That is, gate auxiliary line 13, which is formed in the same layer as that of gate signal line 11, is formed between two gate signal lines 11 adjacent to each other in the column direction, and formed separately from two gate signal lines 11.

Gate auxiliary line 13 is connected to gate lead-out line 12 overlapping gate auxiliary line 13. Specifically, as illustrated in FIGS. 2, 4, and 5, gate auxiliary line 13 and gate lead-out line 12 overlapping gate auxiliary line 13 are connected to each other through second gate contact hole 10b (second contact hole). Second gate contact hole 10b is a contact portion between gate auxiliary line 13 and gate lead-out line 12, and is made in first insulating film 121 between the first metal layer in which gate auxiliary line 13 is formed and the second metal layer in which gate lead-out line 12 is formed as illustrated in FIGS. 4 and 5.

As illustrated in FIG. 2, in the exemplary embodiment, one gate auxiliary line 13 is connected to gate lead-out line 12 through two second gate contact holes 10b. Specifically, one of two second gate contact holes 10b is made at a position corresponding to one end in a longitudinal direction of gate auxiliary line 13, and the other of two second gate contact holes 10b is made at a position corresponding to the other end in the longitudinal direction of gate auxiliary line 13.

Thus, a resistance of gate signal line 11 can be reduced by forming gate auxiliary line 13 connected to gate signal line 11.

As illustrated in FIGS. 3 to 5, second insulating film 122 is formed above first transparent substrate 110 so as to cover TFT 30, gate signal line 11, gate lead-out line 12, gate auxiliary line 13, and source signal line 20. Specifically, second insulating film 122 covers the second metal layer (in the exemplary embodiment, the layer in which gate lead-out line 12, source signal line 20, and source drain electrode SD are formed) formed on first insulating film 121. Second insulating film 122 is constructed with an inorganic insulating film made of an inorganic material such as a silicon nitride film. For example, second insulating film 122 that is the inorganic insulating film can be formed by a chemical vapor deposition (CVD) method.

Third insulating film 123 is formed so as to cover second insulating film 122. In the exemplary embodiment, a thickness of third insulating film 123 is larger than a thickness of second insulating film 122. Specifically, the thickness of third insulating film 123 is greater than or equal to 10 times the thickness of second insulating film 122. For example, third insulating film 123 has the thickness of 3000 nm. With this, the distance in the thickness direction between the wiring line such as gate signal line 11 and source signal line 20 and common electrode 50 can be increased, so that a parasitic capacitance generated by the wiring line such as gate signal line 11 and source signal line 20 and common electrode 50 can be reduced. The TFT layer having a laminated structure in which TFT 30, gate signal line 11, and source signal line 20 are formed can be planarized by thickening third insulating film 123. Consequently, third insulating film 123 in which the surface is planarized can be formed, so that common electrode 50 immediately above third insulating film 123 can be formed into a planar shape.

In the exemplary embodiment, third insulating film 123 is constructed with an organic insulating film made of an organic material containing carbon. For example, third insulating film 123 that is the organic insulating film can be formed by applying and hardening a liquid organic material. With this, third insulating film 123 can easily be thickened, so that the surface of third insulating film 123 can easily be planarized over all pixels PX. That is, third insulating film 123 functions as a planarization layer.

Common electrode 50 and pixel electrode 40 formed on TFT substrate 100 are laminated opposite to each other with fourth insulating film 124 interposed therebetween. In the exemplary embodiment, common electrode 50 is formed on third insulating film 123. Fourth insulating film 124 is formed so as to cover common electrode 50, and pixel electrode 40 is formed into a predetermined shape on fourth insulating film 124. Pixel electrode 40 is formed into a comb shape as an example, but is not limited to the comb shape.

Common electrode 50 and pixel electrode 40 are a transparent electrode made of a transparent metal oxide such as indium tin oxide (ITO). Fourth insulating film 124 is made of an inorganic insulating film such as a silicon nitride film. For example, fourth insulating film 124 that is the inorganic insulating film can be formed by the CVD method.

As described above, common electrode 50 is a planar solid electrode formed over all pixels PX. Consequently, the wiring line such as gate signal line 11 and source signal line 20 are covered with common electrode 50, so that the electric field generated in the wiring line such as gate signal line 11 and source signal line 20 can be shielded by common electrode 50. That is, the electric field generated in the TFT layer can be shielded by common electrode 50. Thus, a freedom degree in designing the shape and size of pixel electrode 40 formed on common electrode 50 is improved, so that transmittance and an aperture ratio of pixel PX can easily be improved.

Common electrode 50 is a thin-film planar solid electrode, but as illustrated in FIG. 2, opening 51 is formed on gate signal line 11 in common electrode 50 in order to connect source drain electrode SD of TFT 30 and pixel electrode 40. Thus, a contact hole piercing the insulating layer of the three-layer structure of second insulating film 122, third insulating film 123, and fourth insulating film 124 is made in opening 51 of common electrode 50, and source-drain electrode SD of TFT 30 and pixel electrode 40 are connected to each other through the contact hole in each pixel PX.

Although not illustrated, an alignment film is formed on pixel electrode 40. The alignment film is formed over all pixels PX so as to cover pixel electrode 40 above first transparent substrate 110. The alignment film is in contact with liquid crystal layer 300, and controls an initial alignment angle of liquid crystal molecules in liquid crystal layer 300. Specifically, the alignment film is subjected to a rubbing treatment in order to align initial alignment angles of the liquid crystal molecules in a certain direction.

As illustrated in FIG. 2, common line 60 that is a vertical common electrode extending in the column direction is provided between two pixels PX adjacent to each other in the row direction. That is, common line 60 is formed in parallel to source signal line 20 in planar view.

Common lines 60 are periodically provided in pixel region 2a. In the exemplary embodiment, one common line 60 is provided in every three pixels PX adjacent to one another in the row direction. Specifically, as in gate lead-out line 12, one common line 60 is provided in each unit of three subpixels with the three subpixels of red pixel PXR, green pixel PXG, and blue pixel PXB. Common line 60 may be provided between every pixels adjacent to one another in the row direction.

Common line 60 is electrically connected to common electrode 50. In the exemplary embodiment, as illustrated in FIGS. 3 and 4, common line 60 is provided immediately above common electrode 50. That is, common line 60 is laminated on common electrode 50 while being in contact with common electrode 50.

Common line 60 is made of a material having a resistance lower than that of common electrode 50. For example, common line 60 is a light shielding and conductive metal film made of a metal material. In the exemplary embodiment, common line 60 is made of a copper film. Thus, a time constant of common electrode 50 can be decreased by laminating common line 60 on common electrode 50.

Common line 60 extends in the column direction so as to overlap gate lead-out lines 12. Specifically, common line 60 is located above gate lead-out line 12, and extends in the column direction in which gate lead-out line 12 extends.

Common line 60 covers first gate contact hole 10a connecting gate signal line 11 and gate lead-out line 12 in planar view of TFT substrate 100. That is, common line 60 includes a cover portion covering first gate contact hole 10a.

In the exemplary embodiment, common line 60 is formed wider in the cover portion covering first gate contact hole 10a than other portions. Specifically, common line 60 includes elongated portion 61 extending in the column direction and wide portion 62 that is wider in the row direction than elongated portion 61, and first gate contact hole 10a is covered with wide portion 62 in planar view of TFT substrate 100. That is, wide portion 62 is the cover portion covering first gate contact hole 10a. Thus, by providing wide portion 62, not only first gate contact hole 10a can be covered but also the time constant of common electrode 50 can further be decreased.

Elongated portion 61 is located between two gate signal lines 11 adjacent to each other in the column direction. Elongated portion 61 is a narrow portion narrower than wide portion 62. In the exemplary embodiment, the width of elongated portion 61 is smaller than the width of gate lead-out line 12, and elongated portion 61 is formed so as not to protrude from gate lead-out line 12. However, the present disclosure is not limited to the exemplary embodiment.

Wide portion 62 is located at the intersection of gate signal line 11 and gate lead-out line 12. In the exemplary embodiment, wide portion 62 is wider than gate lead-out line 12. However, the present disclosure is not limited to the exemplary embodiment. In the exemplary embodiment, a length of wide portion 62 in the column direction is smaller than that of elongated portion 61, and is smaller than the width in the column direction of gate signal line 11.

As illustrated in FIG. 3, in sectional view of TFT substrate 100, the width of the portion of common line 60 covering first gate contact hole 10a is greater than or equal to the width of opening 10a1 on the upper side of first gate contact hole 10a. Specifically, assuming that W1b is the width of wide portion 62 of common line 60 and that W3 is the width of opening 10a1 on the upper side of first gate contact hole 10a, width W1 of wide portion 62 and width W3 of the upper opening of first gate contact hole 10a satisfy a relationship of W1b≥W3.

As illustrated in FIG. 3, assuming that a first section is a section (a section taken along a line III-III in FIG. 2) of the TFT substrate 100 cut through first gate contact holes 10a and along the row direction, the width of common line 60 is larger than the width of gate lead-out line 12 in the first section. Specifically, assuming that W2 is the width of gate lead-out line 12, width W1 of wide portion 62 and width W2 of gate lead-out line 12 satisfy a relationship of W1b>W2.

As illustrated in FIG. 4, assuming that a second section is a section (a section taken along a line IV-IV in FIG. 2) of a part of TFT substrate 100 cut along the row direction between two gate signal lines 11 adjacent to each other, the width of common line 60 is smaller than the width of gate lead-out line 12 in the second section. Specifically, assuming that W1a is the width of elongated portion 61 of common line 60, width W1a of elongated portion 61 and width W2 of gate lead-out line 12 satisfy a relationship of W1a<W2.

As illustrated in FIG. 4, the width of common line 60 is smaller than the width of gate auxiliary line 13 in the second section. Specifically, assuming that W4 is the width of gate auxiliary line 13, width W1a of elongated portion 61 and width W4 of gate auxiliary line 13 satisfy a relationship of W1a<W4.

In the exemplary embodiment, width W4 of gate auxiliary line 13 is smaller than width W2 of gate lead-out line 12 in the second section. Specifically, width W4 of gate auxiliary line 13 and width W2 of gate lead-out line 12 satisfy a relationship of W4<W2. Width W4 of gate auxiliary line 13 may be larger than width W2 of gate lead-out line 12.

As illustrated in FIG. 2, common line 60 covers not only first gate contact hole 10a but also second gate contact hole 10b connecting gate signal line 11 and gate auxiliary line 13. Specifically, second gate contact hole 10b is covered with elongated portion 61 of common line 60. In the exemplary embodiment, one elongated portion 61 covers two second gate contact holes 10b.

CF substrate 200 will be described below. As illustrated in FIGS. 3 to 5, CF substrate 200 is a counter substrate opposed to TFT substrate 100. In the exemplary embodiment, CF substrate 200 is a color filter substrate including a color filter.

Specifically, CF substrate 200 includes second transparent substrate 210, and color filter layer 220 and light shielding layer 230 that are formed on second transparent substrate 210. Similarly to first transparent substrate 110, for example, second transparent substrate 210 is a transparent base material of a glass substrate or a transparent resin substrate.

Color filter layer 220 includes a color filter corresponding to each pixel PX. Specifically, color filter layer 220 includes a red color filter corresponding to red pixel PXR, a green color filter corresponding to green pixel PXG, and a blue color filter corresponding to blue pixel PXB. The color filter is formed in the region surrounded by light shielding layer 230 (that is, an opening of light shielding layer 230).

Light shielding layer 230 is a black layer. For example, light shielding layer 230 is made of carbon black. Light shielding layer 230 is formed at each boundary between two pixels PX adjacent to each other in the column direction. Specifically, light shielding layer 230 is formed in a line along the row direction so as to cover at least gate signal line 11. Light shielding layer 230 may be formed in a line along the column direction so as to cover gate lead-out line 12 and source signal line 20. In this case, light shielding layer 230 is a black matrix formed into a lattice shape.

A pair of polarizing plates (not illustrated) is bonded to display panel 2 having the above configuration. For example, one of the pair of polarizing plates is formed on the outer surface of TFT substrate 100, and the other of the pair of polarizing plates is formed on the outer surface of CF substrate 200. The pair of polarizing plates is disposed such that the polarization directions of the polarizing plates are orthogonal to each other. A wave plate may be bonded to the pair of polarizing plates.

In display panel 2, TFT substrate 100 is located on the side of backlight BL, and CF substrate 200 is located on an observer side. That is, in display panel 2, CF substrate 200 is disposed in front of TFT substrate 100.

An exemplary action of TFT substrate 100 and display panel 2 of the exemplary embodiment will be described below including circumstances leading to the present disclosure.

In the display panel, an appearance inspection of TFT substrate may be performed before the liquid crystal layer is sealed between the TFT substrate and the CF substrate. When the TFT substrate is inspected, for example, the TFT substrate is imaged with a camera disposed above the TFT substrate, and presence or absence of an abnormality in the pixel region is determined based on captured images. In this case, instead of imaging the entire TFT substrate, the imaging is repeatedly performed for respective units each including a plurality of pixels (for example, 3 pixels of RGB) in a range smaller than or equal to a specific size in the pixel region, and the presence or absence of the abnormality is determined for each acquired image. Specifically, the presence or absence of a defect of the pixel is determined by observing a difference between a plurality of images obtained by the periodical and repeated imaging. For example, whether the TFT or the wiring line is normally formed is determined based on the captured images.

At this point, in the TFT substrate having the structure in which the plurality of gate lead-out lines intersect with the plurality of gate signal lines, the gate contact holes connecting the plurality of gate lead-out lines and the plurality of gate signal lines are non-periodically made in the pixel region. For this reason, the above method for inspecting the appearance of the TFT substrate based on the images obtained by periodical and repeated imaging for respective units each including the plurality of pixels cannot deal with the TFT substrate having the structure in which the plurality of gate lead-out lines intersect with the plurality of gate signal lines, and the proper determination cannot be made at the position where the gate contact hole exists. Specifically, because the gate contact holes are non-periodically made in the pixel region, the gate contact holes may be erroneously determined as defects of the pixels when the difference between the plurality of images obtained by periodical imaging is observed.

As described above, the appearance inspection of the TFT substrate is hardly performed in the TFT substrate having the structure in which the plurality of gate signal lines intersect with the plurality of gate lead-out lines.

As a result of intensive investigations on this problem, the inventors of the present disclosure have found the TFT substrate for which the appearance inspection can appropriately be perform even if the TFT substrate has the structure in which the plurality of gate signal lines intersect with the plurality of gate lead-out lines.

Specifically, in TFT substrate 100 of the exemplary embodiment, common line 60 provided immediately above common electrode 50 covers first gate contact hole 10a connecting gate signal line 11 and gate lead-out line 12.

Figure 6:
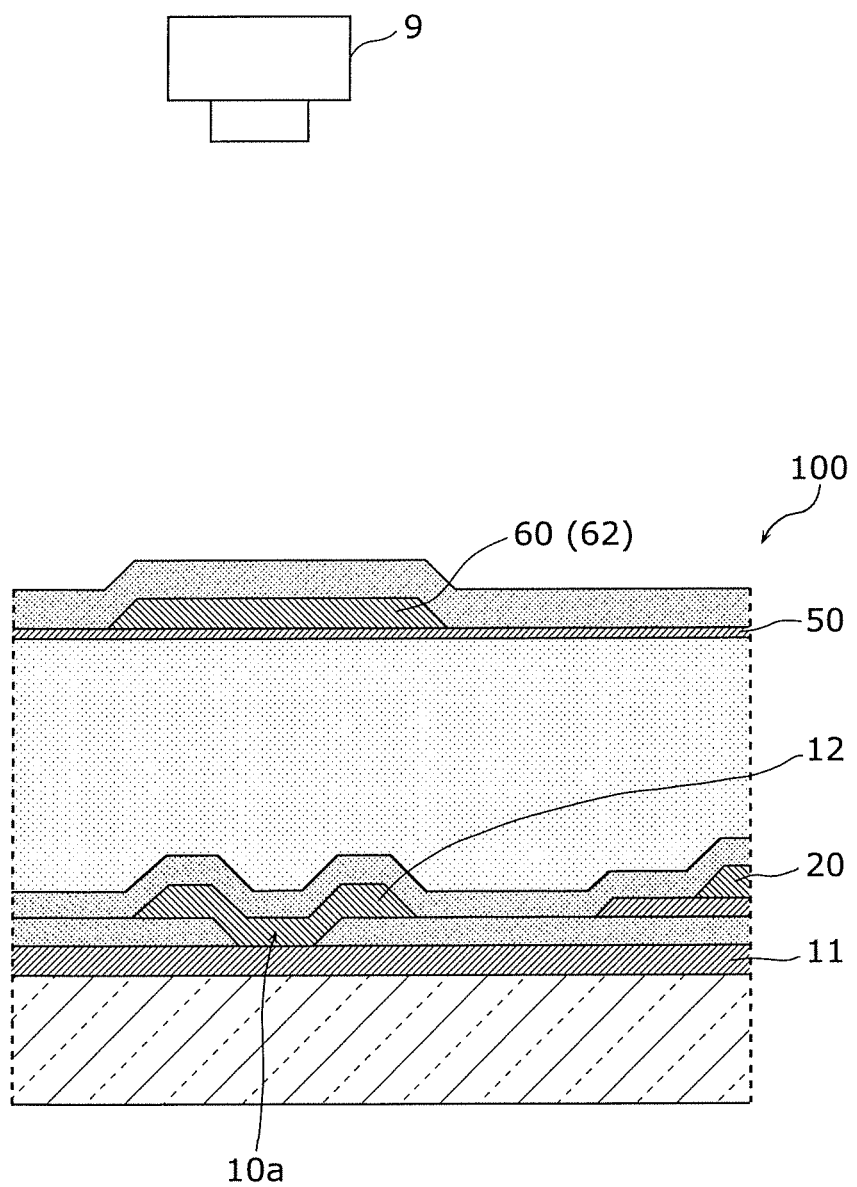
FIG. 6 is a sectional view of a TFT substrate according to the exemplary embodiment when conducting an appearance inspection of the TFT substrate.

With this configuration, as illustrated in FIG. 6, when the appearance inspection of TFT substrate 100 is performed with camera 9 disposed above TFT substrate 100, because first gate contact hole 10a is covered with common line 60, sensitivity of detection of first gate contact hole 10a can be reduced in the image captured with camera 9.

For example, assuming that each unit is composed of a plurality of pixels (for example, three pixels of red pixel PXR, green pixel PXG, and blue pixel PXB) included in the range less than or equal to the specific size in pixel region 2a of TFT substrate 100, when the appearance inspection of TFT substrate 100 is performed by observing the difference between the plurality of images obtained by periodical and repeated imaging for respective units, first gate contact hole 10a does not appear in the image captured with camera 9 because common line 60, such as a metal film, which has a light shielding property overlaps first gate contact hole 10a.

Consequently, even if first gate contact hole 10a is non-periodically made in pixel region 2a, since common line 60 that is periodically provided for each range less than or equal to the specific size, which is a single imaging range, in pixel region 2a covers corresponding first gate contact hole 10a, first gate contact hole 10a can be excluded from a target of the image determination and ignored when the image is determined during the appearance inspection of TFT substrate 100. As a result, a risk of erroneously determining first gate contact hole 10a as the defect of the pixel due to the appearance of first gate contact hole 10a in the image can be reduced. Thus, the appearance inspection of TFT substrate 100 can properly be performed even in TFT substrate 100 having the structure in which the plurality of gate signal lines 11 intersect with the plurality of gate lead-out lines 12.

In this case, in TFT substrate 100 of the exemplary embodiment, the width of the portion of common line 60 covering first gate contact hole 10a is greater than or equal to the width of the upper opening of first gate contact hole 10a in sectional view of TFT substrate 100.

Consequently, each first gate contact hole 10a is wholly covered with common line 60, so that the appearance of first gate contact hole 10a in the image captured with camera 9 can more certainly be prevented when the appearance inspection of TFT substrate 100 is performed with camera 9.

In TFT substrate 100 of the exemplary embodiment, common line 60 extends in the column direction so as to overlap gate lead-out line 12.

Consequently, first gate contact hole 10a can be covered with common line 60 extending in the column direction.

In TFT substrate 100 of the exemplary embodiment, common line 60 extending in the column direction so as to overlap gate lead-out line 12 includes elongated portion 61 extending in the column direction and wide portion 62 wider than elongated portion 61 in the row direction, and first gate contact hole 10a is covered with wide portion 62 of common line 60 in planar view of TFT substrate 100.

As described above, first gate contact hole 10a can certainly be covered with wide portion 62 by forming wide portion 62 in a part of common line 60. Thus, the sensitivity of detection of first gate contact hole 10a in the image captured with camera 9 can further be reduced.

In TFT substrate 100 of the exemplary embodiment, the width of common line 60 is larger than that of gate lead-out line 12 in the first section of TFT substrate 100 cut through first gate contact hole 10a and along the row direction. Specifically, in the first section, the width in the column direction of wide portion 62 of common line 60 is larger than the width of gate lead-out line 12.

Typically, the width of gate lead-out line 12 in the first section is larger than the opening width of first gate contact hole 10a, so that, as described above, first gate contact hole 10a can certainly be covered with common line 60 by making the width of common line 60 larger than the width of gate lead-out line 12 in the first section.

In TFT substrate 100 of the exemplary embodiment, the width of common line 60 is smaller than the width of gate lead-out line 12 in the second section of a part of TFT substrate 100 cut along the row direction between two gate signal lines 11 adjacent to each other. In the second section, the width of common line 60 is smaller than the width of gate auxiliary line 13. Specifically, in the second section, the width in the column direction of elongated portion 61 of common line 60 is smaller than the width of gate lead-out line 12 and the width of gate auxiliary line 13.

With this configuration, first gate contact hole 10a can certainly be covered with wide portion 62 while the line width of whole common line 60 is narrowed by elongated portion 61. Consequently, the sensitivity of detection of first gate contact hole 10a in the image captured with camera 9 can be reduced without wastefully increasing the line width of common line 60.

In the second section, the width of gate auxiliary line 13 is smaller than the width of gate lead-out line 12.

With this configuration, even if gate auxiliary line 13 is provided to decrease the resistance of gate signal line 11, gate auxiliary line 13 can be covered with gate lead-out line 12. Consequently, the sensitivity of detection of gate auxiliary line 13 in the image captured with camera 9 can be reduced when the appearance inspection of TFT substrate 100 is performed with camera 9. For example, gate auxiliary line 13 does not appear in the image captured with camera 9. Thus, the risk of erroneous determination due to the existence of gate auxiliary line 13 can be reduced when the image is determined during the appearance inspection of TFT substrate 100. In particular, similarly to first gate contact hole 10a, when gate auxiliary line 13 is non-periodically provided in pixel region 2a (for example, when gate auxiliary line 13 is provided only in the specific pixel), because gate auxiliary line 13 may cause erroneous determination, gate auxiliary line 13 needs to be covered with gate lead-out line 12.

In TFT substrate 100 of the exemplary embodiment, gate auxiliary line 13 is formed into an island shape.

With this configuration, gate auxiliary line 13 connected to gate signal line 11 through second gate contact hole 10b can be connected only to gate signal line 11 overlapping gate auxiliary line 13.

In TFT substrate 100 of the exemplary embodiment, common line 60 also covers second gate contact hole 10b connecting gate auxiliary line 13 and gate lead-out line 12.

With this configuration, when the appearance inspection of TFT substrate 100 is performed with camera 9, since second gate contact hole 10b is also covered with common line 60, the sensitivity of detection of second gate contact hole 10b can also be reduced. For example, second gate contact hole 10b does not appear in the image captured with camera 9. Consequently, when the image is determined during the appearance inspection of TFT substrate 100, second gate contact hole 10b can also be excluded from the target of the image determination and ignored. As a result, the risk of erroneously determining second gate contact hole 10b as the defect of the pixel due to the appearance of second gate contact hole 10b in the image can also be reduced. Thus, the appearance inspection of TFT substrate 100 can properly be performed even if gate signal line 11 and gate auxiliary line 13 are connected to each other through second gate contact hole 10b in order to decrease the resistance of gate signal line 11. In particular, similarly to first gate contact hole 10a, when second gate contact hole 10b is non-periodically made in pixel region 2a, because second gate contact hole 10b may cause erroneous determination, second gate contact hole 10b needs to be covered with common line 60.

As described above, using TFT substrate 100 of the exemplary embodiment, the appearance inspection of TFT substrate 100 can properly be performed without making the erroneous determination.

Figure 7:
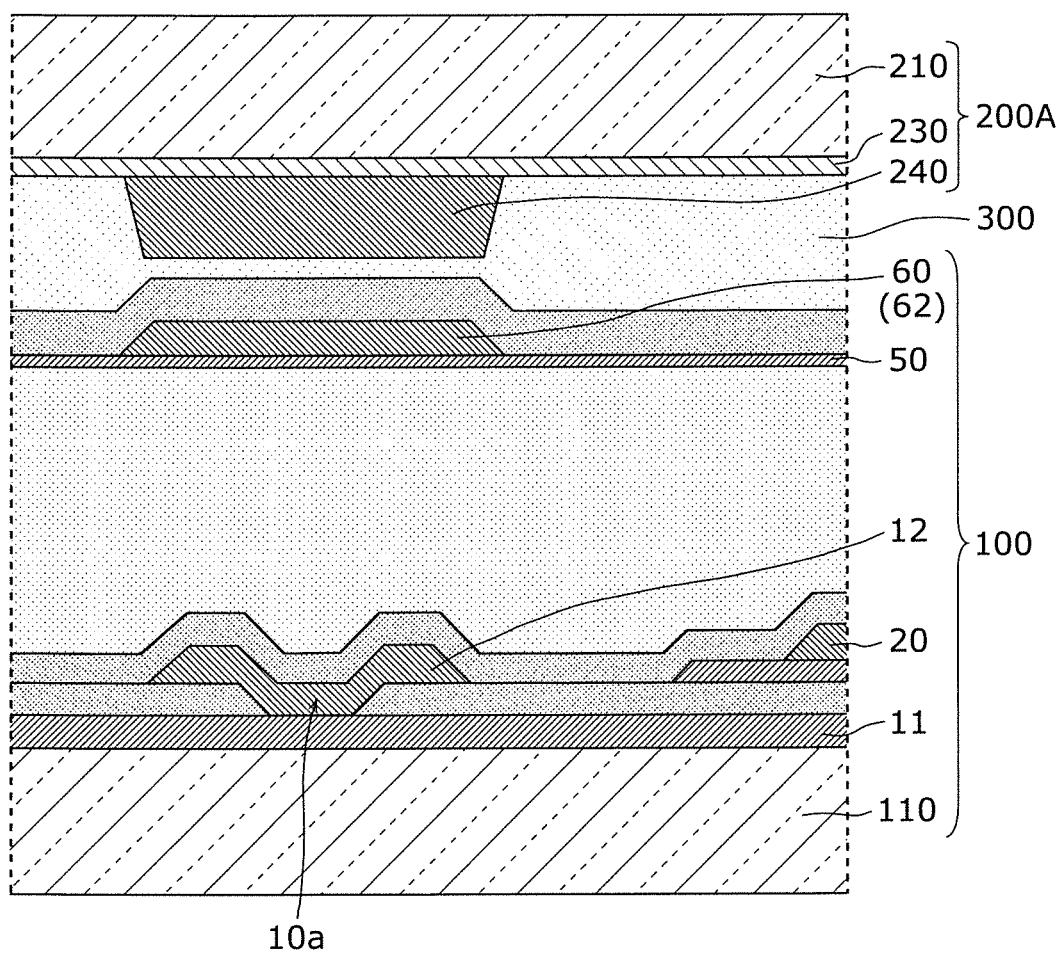
FIG. 7 is a sectional view of the display panel according to a variation.

CF substrate 200A including spacer 240 disposed at a position opposed to wide portion 62 of common line 60 may be used as illustrated in FIG. 7. For example, spacer 240 is formed on second transparent substrate 210 so as to protrude from second transparent substrate 210 toward first transparent substrate 110. Spacer 240 is a member keeping an interval (cell gap) between TFT substrate 100 and CF substrate 200A sandwiching liquid crystal layer 300 constant, and the thickness of liquid crystal layer 300 can be kept constant by providing spacer 240. For example, spacer 240 has a truncated cone shape, and an upper end and a lower end of spacer 240 have a circular shape in planar view. Spacer 240 is made of a resin material such as an acrylic resin, and can elastically be deformed.

In this way, when spacer 240 is provided at the position opposed to wide portion 62 of common line 60, wide portion 62 can function as a pedestal of spacer 240. Consequently, the interval between TFT substrate 100 and CF substrate 200A can be kept constant. Spacers 240 may periodically be disposed in display panel 2, or non-periodically be disposed at any positions in display panel 2.

(Modifications)

The TFT substrate and the display panel of the present disclosure are described above based on the exemplary embodiment, but the present disclosure is not limited to the exemplary embodiment.

For example, in the exemplary embodiment, the widths of gate lead-out lines 12 and source signal lines 20 extending in the column direction are constant along the column direction. However, the present disclosure is not limited to the exemplary embodiment. For example, gate lead-out lines 12 and source signal lines 20 may be widened or narrowed in the middle. Gate lead-out line 12 and source signal line 20 may not be formed in parallel to the column direction, but may be bent in the middle. Similarly, common line 60 may not be formed in parallel to the column direction, but may be bent in the middle similarly to gate lead-out line 12 and source signal line 20. In the exemplary embodiment, wide portion 62 of common wire 60 protrudes in the width direction more than elongated portion 61. Alternatively, wide portion 62 may be formed by forming a recess in common line 60. In this case, wide portion 62 is not limited to the shape protruding toward both the sides in the width directions as in the exemplary embodiment, but may have a shape protruding only toward one side in the width direction.

In the exemplary embodiment, the appearance inspection of TFT substrate 100 is performed with camera 9. However, the present disclosure is not limited to the exemplary embodiment. For example, the appearance inspection of TFT substrate 100 may be performed by human visual observation with no use of an imaging device such as camera 9.

In the exemplary embodiment, gate signal line 11, gate lead-out line 12, and source signal line 20 are orthogonal to one another (that is, intersect at 90°). However, the present disclosure is not limited to the exemplary embodiment. For example, gate signal line 11, gate lead-out line 12, and source signal line 20 may intersect with one another at any angle other than 900.

In the exemplary embodiment, the liquid crystal display panel is used as display panel 2. However, the present disclosure is not limited to the exemplary embodiment. For example, display panel 2 may be another display device such as an organic EL panel or an inorganic EL panel. That is, TFT substrate 100 of the exemplary embodiment can also be applied to the organic EL panel, the inorganic EL panel, and the like.

In the exemplary embodiment, gate driver IC 3a and source driver IC 4a are mounted on display panel 2 (TFT substrate 100) by the COF system. However, the present disclosure is not limited to the exemplary embodiment. For example, gate driver IC 3a and source driver IC 4a may be mounted on display panel 2 by the COG system.

Those skilled in the art will readily appreciate that many modifications are possible in the above exemplary embodiment and variations without materially departing from the novel teachings and advantages of the present disclosure. Accordingly, all such modifications are intended to be included within the scope of the present disclosure.

What is claimed is:

1. A thin film transistor substrate including a pixel region constructed with a plurality of pixels, the thin film transistor substrate comprising:
   a plurality of gate signal lines provided in the pixel region and extending in a first direction;
   a plurality of gate lead-out lines provided in the pixel region and extending in a second direction different from the first direction;

a plurality of thin film transistors and a plurality of pixel electrodes provided in the plurality of pixels respectively;

a common electrode provided across the plurality of pixels; and a common line electrically connected to the common electrode, wherein the plurality of gate signal lines are respectively connected to the plurality of gate lead-out lines through a first contact hole at at least one of a plurality of intersections of the plurality of gate signal lines and the plurality of gate lead-out lines, the common line covers the first contact hole in planar view of the thin film transistor substrate, and the common line extends in the second direction so as to overlap one of the plurality of gate lead-out lines.

2. The thin film transistor substrate according to claim 1, wherein the first contact hole is made in a first insulating film provided between the gate signal lines and the gate lead-out lines, the first contact hole includes an upper opening that faces a side of a corresponding one of the gate lead-out lines and a lower opening that faces a side of a corresponding one of the gate signal lines, and a width of a portion of the common line covering the first contact hole is greater than or equal to a width of the upper opening of the first contact hole in sectional view of the thin film transistor substrate.

3. The thin film transistor substrate according to claim 1, wherein the common line includes an elongated portion extending in the second direction and a wide portion having a width in the first direction greater than a width of the elongated portion, and the first contact hole is covered with the wide portion in planar view of the thin film transistor substrate.

4. The thin film transistor substrate according to claim 1, wherein a width of the common line is larger than a width of the one of the plurality of gate lead-out lines in a first section of the thin film transistor substrate cut through the first contact hole and along the first direction.

5. The thin film transistor substrate according to claim 1, wherein the width of the common line is smaller than the width of the gate lead-out line in a second section of the thin film transistor substrate cut along the first direction between two adjacent gate signal lines among the plurality of gate signal lines.

6. The thin film transistor substrate according to claim 1, further comprising a gate auxiliary line formed in a layer identical to a layer of the gate signal lines and extending in the second direction so as to overlap a corresponding one of the plurality of gate lead-out lines, wherein the gate auxiliary line are connected to one of the plurality of gate lead-out lines overlapping the gate auxiliary line through a second contact hole, and the common line also covers the second contact hole.

7. The thin film transistor substrate according to claim 6, wherein the width of the common line is smaller than a width of the gate auxiliary line in a second section of the thin film transistor substrate cut along the first direction between two adjacent gate signal lines of the gate signal lines.

8. The thin film transistor substrate according to claim 7, wherein the width of the gate auxiliary line is smaller than the width of the one of the plurality of gate lead-out lines in the second section.

9. The thin film transistor substrate according to claim 6, wherein the gate auxiliary line is formed in an island shape.

10. The thin film transistor substrate according to claim 1, further comprising:

a first insulating film covering the gate signal line;

a second insulating film covering the gate lead-out line; and a third insulating film containing carbon and covering the second insulating film, wherein a thickness of the third insulating film is larger than thicknesses of the first insulating film and the second insulating film.

11. A display panel comprising:

the thin film transistor substrate according to claim 1; and a counter substrate opposed to the thin film transistor substrate.

12. The display panel according to claim 11, further comprising:

a liquid crystal layer disposed between the thin film transistor substrate and the counter substrate; and a spacer disposed above a portion covering the first contact hole in the common line.

* * * * *